(12) United States Patent
Hyun

(10) Patent No.: US 9,373,540 B2
(45) Date of Patent: Jun. 21, 2016

(54) SEMICONDUCTOR DEVICE AND METHOD OF FABRICATING THE SAME

(71) Applicant: SK hynix Inc., Gyeonggi-do (KR)

(72) Inventor: Chan Sun Hyun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/465,541

(22) Filed: Aug. 21, 2014

(65) Prior Publication Data

US 2015/0270165 A1   Sep. 24, 2015

(30) Foreign Application Priority Data

Mar. 21, 2014   (KR) .................. 10-2014-0033682

(51) Int. Cl.
*H01L 21/768*   (2006.01)
*H01L 27/115*   (2006.01)
*H01L 23/50*   (2006.01)

(52) U.S. Cl.
CPC .... *H01L 21/76843* (2013.01); *H01L 21/76802* (2013.01); *H01L 23/50* (2013.01); *H01L 27/1157* (2013.01); *H01L 27/11524* (2013.01); *H01L 27/11548* (2013.01); *H01L 27/11556* (2013.01); *H01L 27/11575* (2013.01); *H01L 27/11582* (2013.01)

(58) Field of Classification Search
CPC .............. H01L 21/76802; H01L 21/76843; H01L 27/1156; H01L 27/1182
USPC ......................................... 257/329
See application file for complete search history.

(56) References Cited

U.S. PATENT DOCUMENTS

| | | | |
|---|---|---|---|
| 8,304,348 B2 | 11/2012 | Hashimoto | |
| 2011/0031630 A1* | 2/2011 | Hashimoto | H01L 27/11578 257/774 |
| 2013/0127011 A1* | 5/2013 | Higashitani | H01L 28/87 257/532 |
| 2015/0255386 A1* | 9/2015 | Lee | H01L 23/5226 257/774 |

FOREIGN PATENT DOCUMENTS

| | | |
|---|---|---|
| KR | 1020140089793 | 7/2014 |
| KR | 1020150073251 | 7/2015 |

* cited by examiner

*Primary Examiner* — Matthew W Such
*Assistant Examiner* — Warren H Kilpatrick
(74) *Attorney, Agent, or Firm* — IP & T Group LLP

(57) ABSTRACT

A semiconductor device and a method of fabricating the same are provided. The semiconductor device includes conductive patterns and interlayer insulating patterns having a stair structure and being alternately stacked, pad patterns connected to end portions of upper surfaces of the conductive patterns exposed through the stair structure, and a channel film penetrating the conductive patterns and the interlayer insulating patterns.

20 Claims, 9 Drawing Sheets

SEMICONDUCTOR DEVICE AND METHOD OF FABRICATING THE SAME

CROSS-REFERENCE TO RELATED APPLICATION

The present application claims priority to Korean patent application number 10-2014-0033682, filed on Mar. 21, 2014, the entire disclosure of which is incorporated herein in its entirety by reference.

BACKGROUND

1. Field of the Invention

Various exemplary embodiments of the present invention relate to a semiconductor device and a method of fabricating the same, and more specifically, to a semiconductor device having a structure in which a plurality of films are stacked and a method of fabricating the same.

2. Description of Related Art

Various structures are being developed to increase the degree of integration in semiconductor devices. For example, devices having memory cells arranged in a three-dimensional form have been introduced.

Three-dimensional semiconductor devices may include interlayer insulating films and conductive patterns, which are alternately stacked, and a channel film penetrating therethrough. The channel film may be formed by filling a through hole with a semiconductor film after forming the through hole penetrating the interlayer insulating films and the conductive patterns. The through hole may be formed by etching the interlayer insulating films and sacrificial films after alternately stacking the interlayer insulating films and the sacrificial films. After forming the channel film, the etched sacrificial films are removed. Then the areas from which the etched sacrificial films are removed are filled with the conductive patterns. In the process of filling the areas from which the sacrificial films are removed with the conductive patterns, an air gap may be formed in the conductive patterns due to various reasons.

The conductive patterns are connected to contact plugs to be supplied with power from the outside (e.g. an external source or device). The air gaps formed in the conductive patterns may cause a punching phenomenon in which holes are formed in the conductive patterns in the process of forming the contact plugs. Further, when the conductive patterns lack process margin due to the limited thickness of the sacrificial films, the punching phenomenon may occur. The punching phenomenon of the conductive patterns may cause bridges between the conductive patterns.

SUMMARY

Exemplary embodiments of the present invention are directed to a semiconductor device capable of reducing process errors, and a method of fabricating the same.

One embodiment of the present invention provides a method of fabricating a semiconductor device, including forming a stacked body having sacrificial films and interlayer insulating films which are alternately stacked and having a stair structure exposing end portions of the sacrificial films, forming pad patterns on the end portions of the sacrificial films exposed through the stair structure, forming a slit for exposing the sacrificial films by penetrating the stacked body, forming recess areas by removing the sacrificial films through the slit, and forming conductive patterns in the recess areas.

Another embodiment of the present invention provides a semiconductor device, including conductive patterns and interlayer insulating patterns having a stair structure and that are alternately stacked, pad patterns connected to end portions of upper surfaces of the conductive patterns exposed through the stair structure, and a channel film penetrating the conductive patterns and the interlayer insulating patterns.

Still another embodiment of the present invention provides a semiconductor device, including conductive patterns and interlayer insulating patterns having a stair structure and that are alternately stacked, insulating films covering surfaces of the conductive films, pad patterns formed on end portions of the insulating films exposed through the stair structure, and contact plugs connected to the conductive patterns by penetrating the pad patterns and the insulating films.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
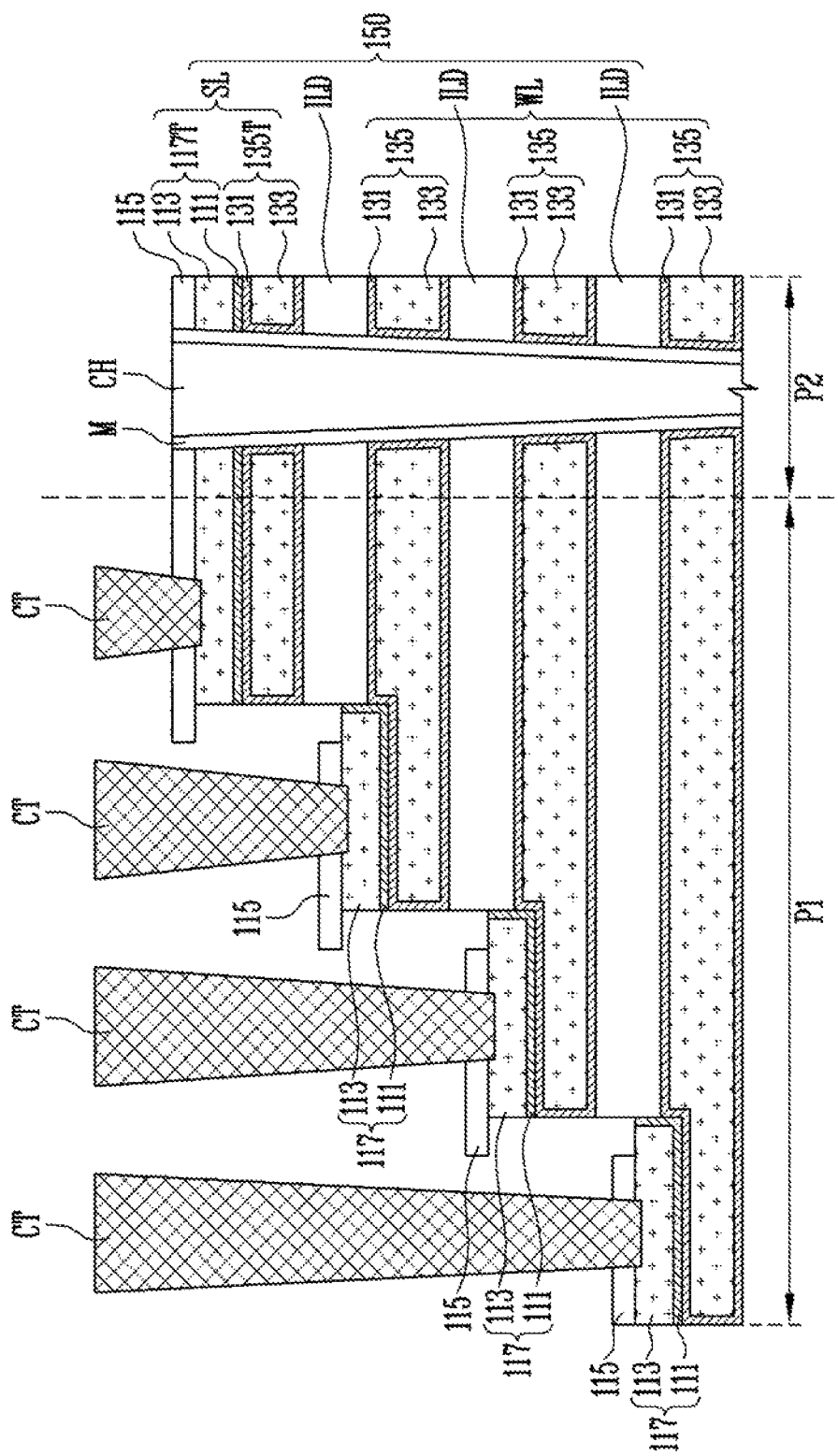
FIG. 1 is a cross-sectional view illustrating a semiconductor device according to one exemplary embodiment of the present invention.

The present invention will be described more fully with reference to the accompanying drawings, in which exemplary embodiments of the invention are shown. This invention may, however, be embodied in different forms and should not be construed as limited to the embodiments set forth herein. Exemplary embodiments of the present invention are described below in sufficient detail to enable those of ordinary skill in the art to embody and practice the present invention. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, the singular form may include the plural form, and vice versa, as long as it is not specifically mentioned otherwise.

FIG. 1 is a cross-sectional view illustrating a semiconductor device according to one exemplary embodiment of the present invention.

Referring to FIG. 1, a semiconductor device may include a contact region P1 and a cell region P2. The cell region P2 may be a region in which a memory string is arranged. The memory string may include memory cells arranged in a three-dimensional form. The contact region P1 may be a region in which contact plugs CT connected to the memory string are arranged.

The memory string may include the memory cells and select transistors which are serially connected along a channel film CH penetrating a stacked body 150. In FIG. 1, only some of the memory cells and the select transistors, which are formed on an upper portion of the stacked body 150, are illustrated.

The channel film CH may be changed to have various structures such as a straight shaped structure, U-shaped structure, W-shaped structure, etc. depending on the structure of the memory string to be formed. The channel film CH may be covered by a multilayer insulating pattern M. The multilayer insulating pattern M may include at least one of a tunnel insulating film, a data storage film, and a blocking insulating film. The tunnel insulating film may cover the channel film CH and be in contact with the channel film CH. The data storage film may cover the tunnel insulating film and be in contact with the tunnel insulating film. The blocking insulating film may cover the data storage film and be in contact with the data storage film. The tunnel insulating film may be formed of a silicon oxide film. The data storage film may be formed of a material capable of storing a charge in various manners. For example, the data storage film may be formed of a polysilicon film floating the charge, or a silicon nitride film trapping the charge, etc. The blocking insulating film may include at least one of a silicon oxide film and a high-k dielectric film having a higher dielectric constant than the silicon oxide film.

The stacked body 150 may include conductive patterns 135 and 135T and Interlayer Insulating patterns ILD, which are alternately stacked. The stacked body 150 may extend from the cell region P2 to the contact region P1, and have a stair structure in the contact region P1. More specifically, the lower the conductive patterns 135 and 135T are in the stacked body 150, the longer the conductive patterns 135 and 135T of the stacked body 150 extend toward the contact region P1. Thus, the conductive patterns 135 and 135T may have the stair structure in the contact region P1. The lower the interlayer Insulating patterns ILD are in the stacked body 150, the longer the interlayer insulating patterns ILD of the stacked body 150 extend toward the contact region P1. It is in this manner that the interlayer insulating patterns ILD may have a stair structure in the contact region P1. The stacked body 150 may be separated by a slit (not shown).

At least one uppermost conductive pattern (for example, 135T) of the conductive patterns 135 and 135T of the stacked body 150 may be used as a select line SL connected to the select transistor. The conductive patterns 135 below the select line SL may be used as word lines WL connected to the memory cells. Structures below the word lines WL may be varied depending on the structure of the memory string to be formed.

Pad patterns 117 and 117T may be formed on the conductive patterns 135 and 135T exposed through the stair structure. The uppermost pad pattern 117T connected to the uppermost conductive pattern 135T may be formed by extending from the contact region P1 to the cell region P2 along the select line SL. The uppermost pad pattern 117T may form a portion of the select line SL by being connected to the uppermost conductive pattern 135T, and be penetrated by the channel film CH. Since the select line SL includes the uppermost conductive pattern 135T and the uppermost pad pattern 117T connected to an upper portion thereof, the select line SL may be formed to have a greater thickness than the word lines WL.

Accordingly, since the length of the channel area of the select transistor becomes longer, the leakage current of the select transistor may decrease. Further, since the thickness of the select line SL becomes thicker, the resistance of the select line SL may decrease. The pad patterns 117 below the uppermost pad pattern 117T may connect to upper surfaces of the conductive patterns 135 exposed through the stair structure in the contact region P1.

In the process of patterning the pad patterns 117 and 117T, protective patterns 115 used as etching masks may remain on the pad patterns 117 and 117T. The contact plugs CT may connect to the pad patterns 117 and 117T of the contact region P1 by penetrating the protective patterns 115. One side of the protective patterns 115 may protrude outside the stair structure relative to one side of the pad patterns 117 and 117T. Alternatively, the one side of the protective patterns 115 may be matched with the one side of the pad patterns 117 and 117T.

Each of the pad patterns 117 and 117T may be formed of a conductive material such as polysilicon, metal silicide, a metal film, etc. In order to form the pad patterns 117 and 117T with a low resistance, each of the pad patterns 117 and 117T may be formed of a first metal film 113 with a low resistance such as tungsten. In this case, a first barrier metal film 111 may further be formed along at least one side of the first metal film 113. In order to prevent an air gap from being formed in the pad patterns 117 and 117T, the pad patterns 117 and 117T may be formed before forming the conductive patterns 135 and 135T. The pad patterns 117 and 117T may be formed by depositing the first barrier metal film 111 and the first metal film 113, and etching the first barrier metal film 111 and the first metal film 113. The first barrier metal film 111 of the pad patterns 117 and 117T may be formed along a surface of the first metal film 113, which is in contact with the conductive patterns 135 and 135T, and the interlayer insulating patterns ILD, excluding the surface of the first metal film 113 which is not in contact with the conductive patterns 135 and 135T and the interlayer insulating pattern ILD.

Each of the conductive patterns 135 and 135T may be formed of a conductive material such as polysilicon, metal silicide, a metal film, etc. In order to form the conductive patterns 135 and 135T with a low resistance, each of the conductive patterns 135 and 135T may be formed of a second metal film 133 with a low resistance such as tungsten. In this case, a second barrier metal film 131 may further be formed along a surface of the second metal film 133.

In order to prevent an air gap from being formed in the conductive patterns 135 and 135T of the contact region P1, an end portion of each of the conductive patterns 135 and 135T may be formed to have the same thickness as remaining portions thereof or a smaller thickness than the remaining portions thereof.

When the end portion of each of the conductive patterns 135 and 135T are formed to have a greater thickness than the center portion of each of the conductive patterns 135 and 135T, unlike described above, an end portion of each of recess defining areas, in which the conductive patterns 135 and 135T are formed, is to be formed to have a greater thickness than a center portion of each of the recess areas. In the process of forming the conductive patterns 135 and 135T by filling the recess areas with a conductive material, before the end portion of each of the recess areas is filled with the conductive material, the center portion of each of the recess areas may be filled with the conductive material. As a result, an air gap may be formed in the end portions of the recess areas corresponding to the end portions of the conductive patterns 135 and 135T.

In the present invention, even when the end portion of each of the conductive patterns 135 and 135T arranged in the contact region P1 does not have to be very thick, the process margin in forming the contact plug CT may be secured through the pad patterns 117 and 117T formed without an air gap through separate deposition process and etch processes. Further, in the present invention, the process margin of forming the contact plug CT may be secured by preventing a phenomenon in which an air gap is formed in the end portions of the conductive patterns 135 and 135T.

FIGS. 2A to 2H are cross-sectional views for describing a method of fabricating a semiconductor device according to one exemplary embodiment of the present invention. FIGS. 2A to 2H are cross-sectional views focused on a contact region.

Figure 2A:
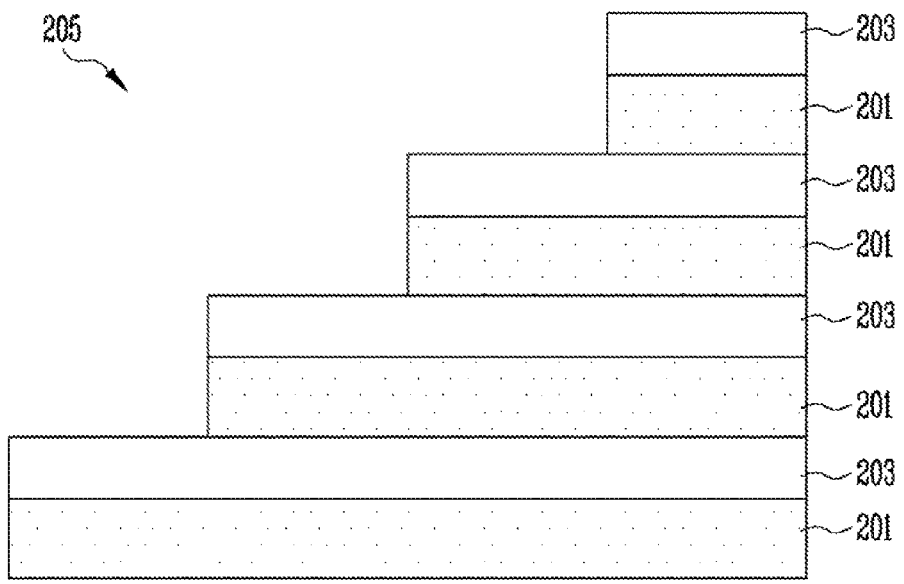
FIGS. 2A to 2H are cross-sectional views for describing a method of manufacturing a semiconductor device according to one exemplary embodiment of the present invention.

As shown in FIG. 2A, in a method of fabricating a semiconductor device according to an exemplary embodiment of the present invention, first material films 201 and second material films 203 are alternately stacked. The number of the first material films 201 and the second material films 203 which are stacked may be variably set. The first material films 201 and the second material films 203 may be formed on a substrate (not shown) including a lower structure (not shown) covered by an insulating film (not shown). The lower structure may be a source area formed by implanting impurities in the substrate, or a source area formed by patterning a doped polysilicon film after forming the doped polysilicon film on the substrate. Alternatively, the lower structure may be a pipe gate in which a pipe trench is formed.

The first material films 201 may be formed in layers in which conductive patterns are formed, and the second material films 203 may be formed in layers in which interlayer insulating patterns are formed. The first material films 201 may be formed of a material different from that of the second material films 203. More specifically, the first material films 201 may be formed of a material having an etch selectivity to the second material films 203. For example, the second material films 203 may be formed of an insulating material for an interlayer insulating pattern, and the first material films 201 may be formed of an insulating material for a sacrificial film. An oxide film may be used as the insulating material for the interlayer insulating pattern, and a nitride film having an etch selectivity to the oxide film may be used as the insulating material for the sacrificial film.

A preliminary stair structure 205 may be formed by etching the first material films 201 and the second material films 203. Each stair of the preliminary stair structure 205 may include one first material film 201 and one second material film 203 formed on the first material film 201. A portion of each of upper surfaces of the second material films 203 may be exposed through the preliminary stair structure 205.

Figure 2B:
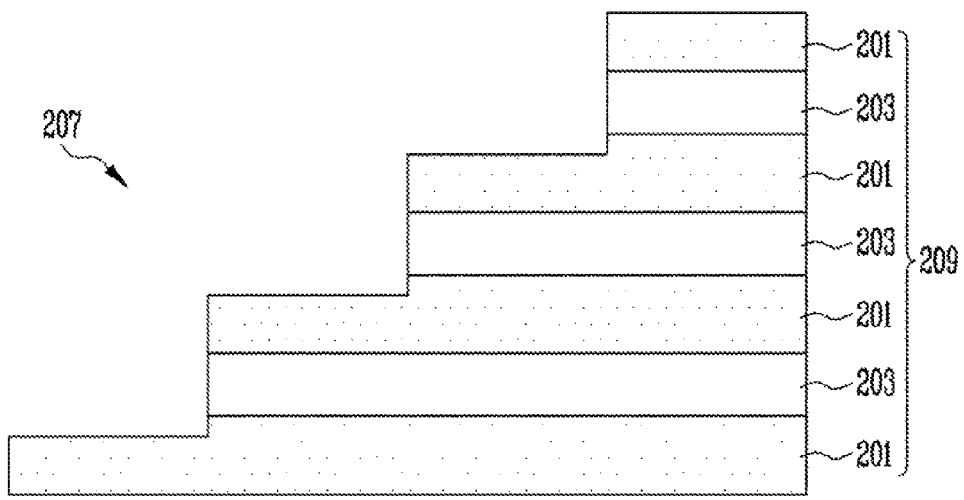

As shown in FIG. 2B, the second material films 203 exposed through the preliminary stair structure 205 may be etched. As a result, a stacked body 209 may be formed to include the first material films 201 and the second material films 203, which are alternately stacked and have a stair structure 207 exposing the first material films 201. Each stair of the stair structure 207 may include one first material film 201 and further include one second material film 203 formed below the first material film 201.

The first material films 201 and the second material films 203 may be stacked unlike the stacking sequence shown in FIG. 2A, and the first material film may be arranged as the uppermost layer of the stacked structure. In this case, without the forming of the preliminary stair structure 205, the stair structure 207 exposing the first material films 201 may be formed as shown in FIG. 2B by etching the first material films 201 and the second material films 203.

An end portion of each of the first material films 201 may be partially etched when the second material films 203 are etched to form the stair structure 207. In this case, the end portion of each of the first material films 201 forming the stair structure 207 may be formed to have a smaller thickness than the center portion of each of the first material films 201. The second material films 203 may be etched by various methods such as plasma etching, wet etching, or dry etching, etc. When the end portion of each of the first material films 201 forming the stair structure 207 are formed to have a smaller thickness than the center portion of each of the first material films 201, a short circuit between conductive patterns (235 of FIG. 2H) by pad patterns (217P of FIG. 2H) may be prevented. Further, when the end portion of each of the first material films 201 forming the stair structure 207 is formed to have a smaller thickness than the center portion thereof, an end portion of each of the recess areas 225, to be described below with reference to FIG. 2F, may have a smaller thickness than the center portion thereof. Thus, the end portion of each of recess areas 225 may easily be filled with a conductive film.

Although not shown in the drawing, after the forming of the stair structure 207 or before the forming of the preliminary stair structure 205, the channel film CH described with reference to FIG. 1 may be formed in the cell region P2. The channel film CH may be formed in a through hole after forming the through hole penetrating the first material films 201 and the second material films 203. The channel film CH may be formed in a tube shape by forming a semiconductor film along a surface of the through hole to empty the central axis area of the through hole. The central axis area of the channel film CH with the tube shape may be filled with an insulating material. Alternatively, the channel film CH may be formed by disposing the semiconductor film in the through hole to fill the inner area of the through hole. Alternatively, the channel film CH may include a first semiconductor film having a tube shape and a second semiconductor film filling the central axis area of the through hole. Before forming the channel film CH, the multilayer insulating pattern M described with reference to FIG. 1 may further be formed along a surface of the through hole.

Figure 2C:
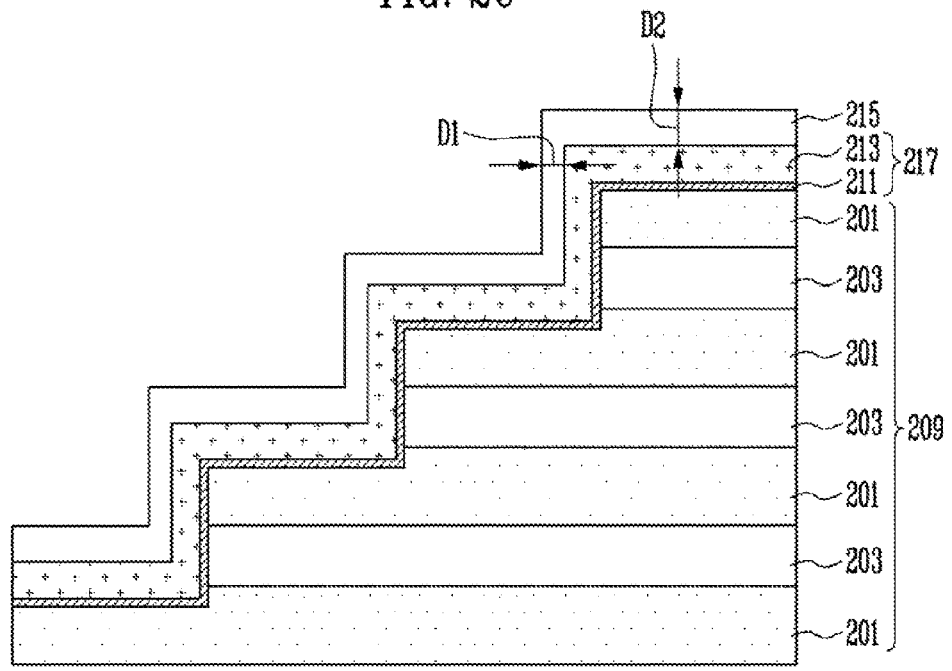

As shown in FIG. 2C, a first conductive film 217 may be formed along a surface of a stacked body 209 including the first material films 201 exposed through the stair structure 207. The first conductive film 217 may be formed along sidewalls and upper surfaces of the stair structure 207. The first conductive film 217 may be formed as a conductive film having a single layer, or a double layer including a first barrier metal film 211 and a first metal film 213. The first barrier metal film 211 may be formed of TIN, and the first metal film 213 may be formed of tungsten.

Continuously, a protective film 215 may be formed along a surface of the first conductive film 217. The protective film 215 may be formed of an insulating material having weak step coverage characteristics. More specifically, the protective film 215 may be formed of an insulating material such that the protective film 215 may have a greater deposition thickness D2 in the upper surfaces of the stair structure 207 than the deposition thickness D1 in the sidewalls of the stair structure 207. For example, the protective film 215 may include at least one among a high density plasma (HDP) oxide film, a plasma enhanced-tetra ethyl ortho silicate (PE-TEOS) oxide film, an undoped silicate glass (USG) oxide film, and a plasma enhanced (PE) nitride film.

Figure 2D:
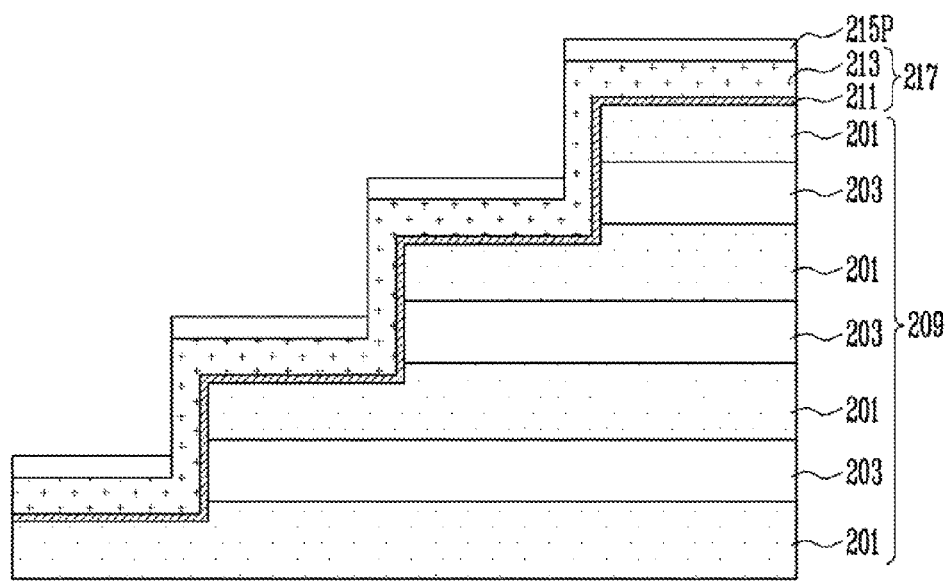

As shown in FIG. 2D, protective patterns 215P may be formed by etching the protective film 215 such that some areas of the first conductive film 217 formed along the sidewalls of the stair structure 207 are exposed. The protective film 215 may be etched by a wet etch process. Since the protective film 215 is formed to have a relatively greater thickness on the upper surfaces of the stair structure 207 relative to the sidewalls thereof, even when the protective film 215 formed on the sidewalls of the stair structure 207 is removed by the etch process, the protective film 215 formed on the upper surfaces of the stair structure 207 may remain as protective patterns 215P. The protective patterns 215P may protect the first conductive film 217 on the upper surfaces of the stair structure 207. Further, the protective patterns 215P may expose the first conductive film 217 on the sidewalls of the stair structure 207.

Figure 2E:
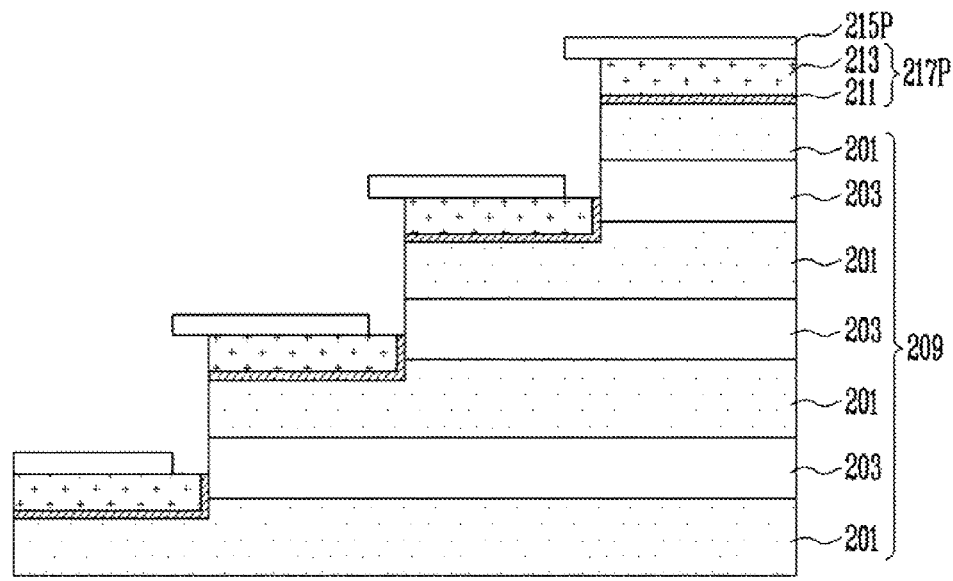

As shown in FIG. 2E, sidewalls of the first material films 201 may be exposed by removing some areas of the first conductive film 217 by an etch process using the protective patterns 215P as etch masks. Remaining areas of the first conductive film 217 protected by the protective patterns 215P may remain as pad patterns 217P connected to the first material films 201. The first conductive film 217 may be etched by a wet etch process. At this time, $H_2SO_4$, having high etching selectivity to the first and second material films 201 and 207, may be used an etchant. The pad patterns 217P may expose sidewalls of the second material films 203 so that the first material films 201 may not be coupled to each other through the pad patterns 217P. In the process described with reference to FIG. 2B, when an end portion of each of the first material films 201 forming the stair structure 207 is formed to have a smaller thickness than a center portion thereof, the sidewalls of the second material films 203 may be easily exposed by the etch process for forming the pad patterns 217P.

Although not shown in the drawing, the amount of etching of the protective film 215 may increase in the formation of the protective patterns 215P, described with reference to FIG. 2D, such that one side of each of the protective patterns 215P is matched to one side of each of the pad patterns 217P.

Figure 2F:
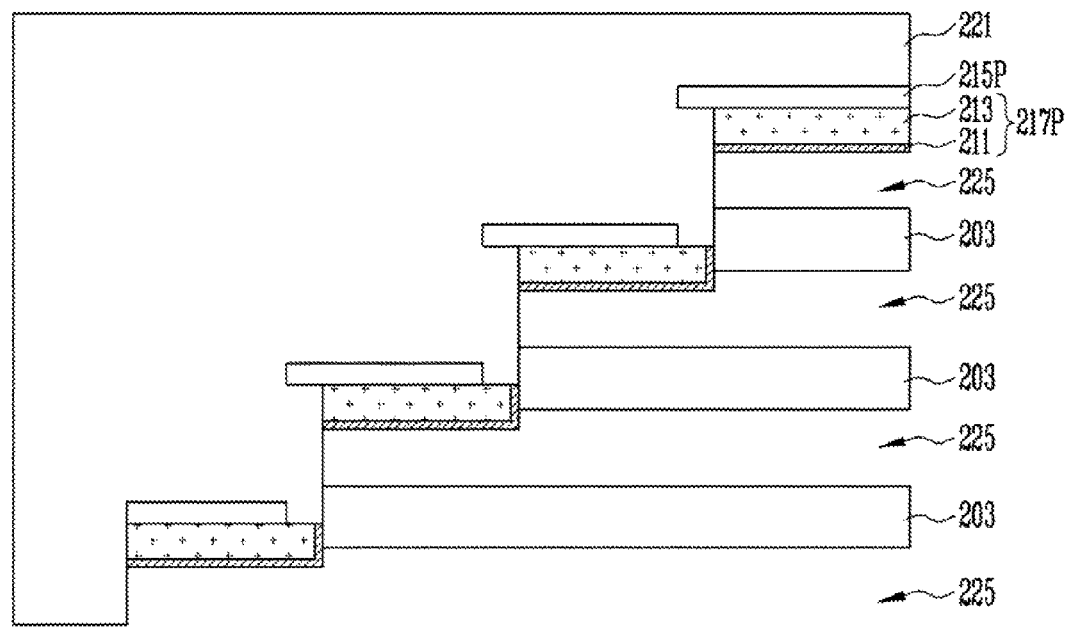

As shown in FIG. 2F, an insulating film 221 may be formed on a structure having the pad patterns 217P formed therein. The surface of the insulating film 221 may be planarized by a planarization process.

Continuously, the first material films 201 may be exposed by forming a slit (not shown) penetrating the insulating film 221, the protective patterns 215P, the pad patterns 217P, and the stacked body 209. The number of slits and the shape of the slit may be variably changed.

Recess areas 225 may be formed by removing the first material films 201 exposed through a sidewall of the slit. In the process described with reference to FIG. 2B, when an end portion of each of the first material films 201 remains to have a smaller thickness than the center portion thereof, an end portion of each of the recess areas 225 may be formed to have a smaller thickness than the center portion thereof.

Figure 2G:
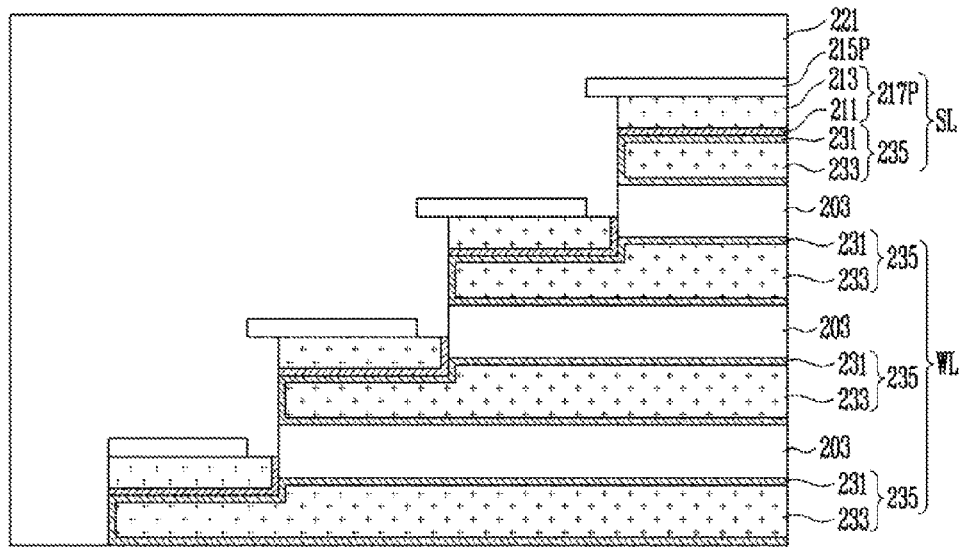

As shown in FIG. 2G, conductive patterns 235 may be formed in the recess areas 225. After filling the recess areas 225 opened through the slit with a second conductive film, the conductive patterns 235 may be formed by removing a portion of the second conductive film remaining in the slit. The second conductive film may be formed as a conductive film with a single layer, or a double layer including a second barrier metal film 231 formed along surfaces of the recess areas 225 and a second metal film 233 formed to fill the recess areas 225 on the second barrier metal film 231. The second barrier metal film 231 may be formed of TIN, and the second metal film 233 may be formed of tungsten. The second barrier metal film 231 and the second metal film 233 may be removed from the slit, and remain in the recess areas 225. Thus, the conductive patterns 235 may be formed. In the process described with reference to FIG. 2B, when the end portion of each of the first material films 201 has a smaller thickness than the center portion thereof, an end portion of each of the conductive patterns 235 may have a smaller thickness than a center portion thereof.

In the present invention, the end portion of each of the recess areas 225 may not have a greater thickness than the center portion thereof, but may have the same thickness as the center portion of each of the recess areas 225 or a smaller thickness than the center portion of each of the recess areas 225. Accordingly, in the process of filling the recess areas 225 with a second conductive film for forming the conductive patterns 235, the phenomenon in which the center portion of each of the recess areas 225 is filled with a second conductive film before the end portion of each of the recess areas 225 may be prominently prevented. As a result, that phenomenon in which an air gap is formed in the end portion of each of the conductive patterns 235 may be prevented.

The uppermost conductive pattern of the conductive patterns 235 and the uppermost pad pattern of the pad patterns 217P may be used as a select line SL, and the conductive patterns 235 below the select line SL may be used as word lines WL.

Figure 2H:
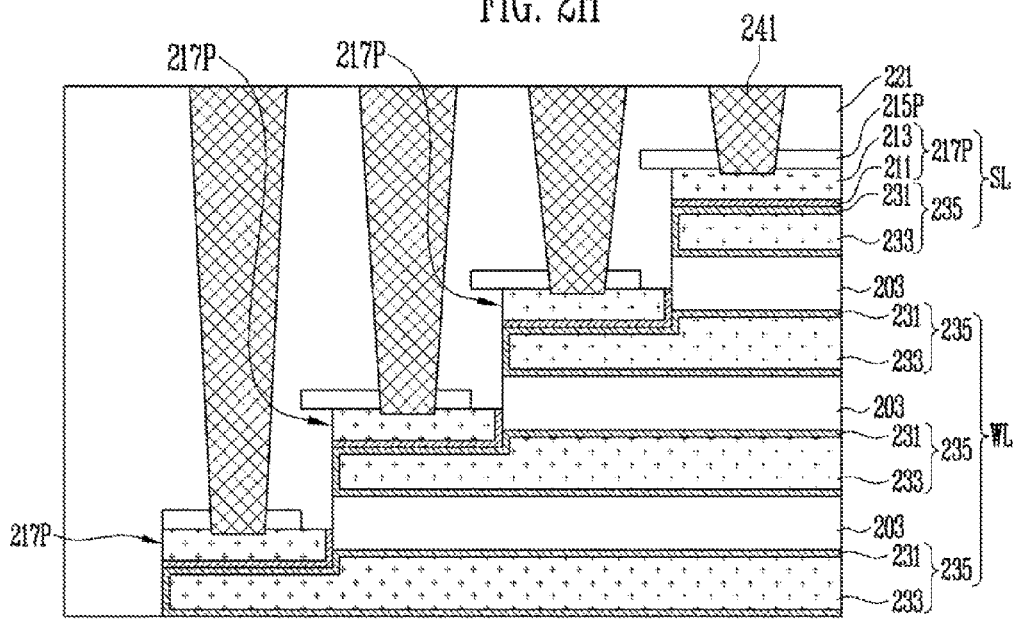

As shown in FIG. 2H, contact plugs 241 connected to the pad patterns 217P may be formed by penetrating the insulating film 221. When the protective patterns 215P remain, the contact plugs 241 may further penetrate the protective patterns 215P.

After forming the contact holes exposing pad patterns 217P by etching the insulating film 221 and the protective patterns 215P, the contact plugs 241 may be formed to fill the contact holes with a conductive material. The contact holes may be formed to have different heights depending on the heights of the pad patterns 217P. At this time, the pad patterns 217P arranged on the conductive patterns 235 may be overly etched. In a method of fabricating the semiconductor device according to an embodiment of the present invention, the punching phenomenon in which the pad patterns 217P are penetrated by the contact holes may be prevented since an air gap is not formed in the pad patterns 217P. Further, since the etch margin may be secured by the pad patterns 217P in the forming of the contact holes, the punching phenomenon in which the conductive patterns 235 below the pad patterns 217P are penetrated by the contact holes may be prevented.

Figure 3:
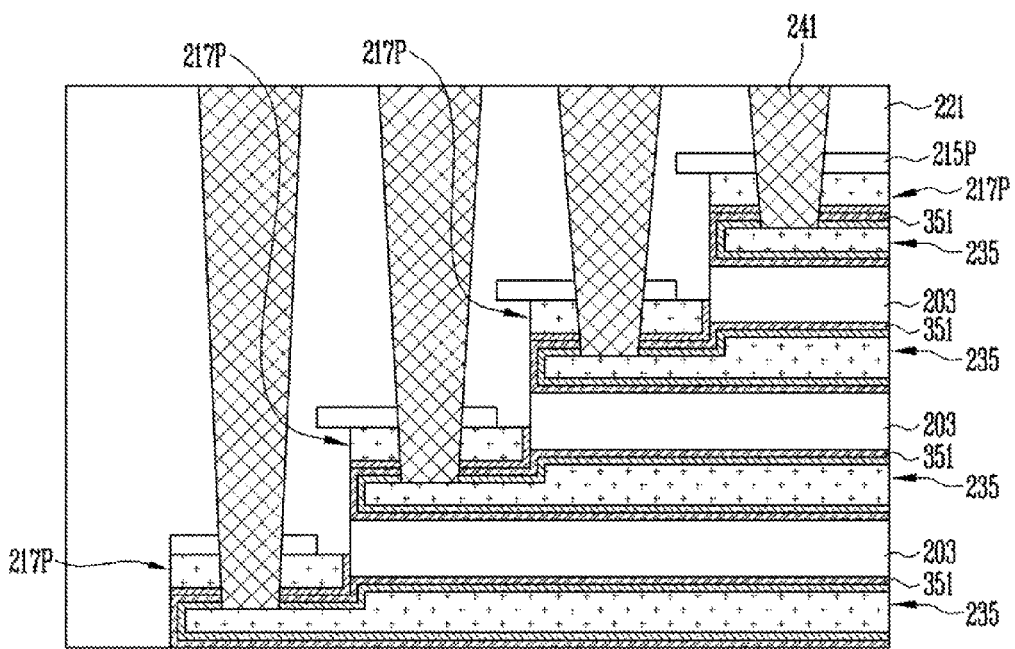
FIG. 3 is a cross-sectional view for describing a semiconductor device and a method of manufacturing the same according to another exemplary embodiment of the present invention.

FIG. 3 is a cross-sectional view for describing a semiconductor device and a method of fabricating the same according to another exemplary embodiment of the present invention. Particularly, FIG. 3 is for describing an additional process of fabricating the semiconductor device described with reference to FIGS. 2A to 2H. For the sake of brevity, a description of elements that have been previously been described will be omitted.

As shown in FIG. 3, the semiconductor device may further include insulating films 351 covering surfaces of the conductive patterns 235. The insulating films 351 covering the conductive patterns 235 may be formed along surfaces of the recess areas 225 described above with reference to FIG. 2F before the forming of the second conductive films described above with reference to FIG. 2G. The insulating films 351 may be insulating films used as blocking insulating films and, for example, may be formed of $Al_2O_3$. The contact plugs 241 may be connected to the conductive patterns 235 by further penetrating the pad patterns 217P and the insulating films 351 covering the conductive patterns 235 compared to the contact plugs shown in FIG. 2H. As a result, the conductive patterns 235 and pad patterns 217P may be electrically connected through the contact plugs 241.

In the present invention, since the end portion of each of the recess areas 225 is not formed to have a greater thickness than the center portion of each of the recess areas 225 as described in FIG. 2F, the phenomenon in which an air gap is formed in the end portion of each of the conductive patterns 235 in the process of forming the conductive patterns 235 may be prevented. As a result, even when the contact plugs 241 penetrate the pad patterns 217P as described in FIG. 3, the punching phenomenon in which the contact plugs 241 completely penetrate the conductive patterns 235 due to an air gap formed in the end portion of each of the conductive patterns 235 may be prevented.

The exemplary embodiments of the present invention described above may form pad patterns on sacrificial films using separate deposition processes and etch processes before replacing the sacrificial films with the conductive patterns. Accordingly, in the exemplary embodiments of the present invention, a phenomenon in which an air gap is formed in the pad patterns may be prevented from occurring. According to the exemplary embodiments of the present invention, the end portion of each of the recess areas may not be very thick. Accordingly, in the present invention, when the contact plugs connected to the pad patterns are formed, the punching phenomenon may be prevented from occurring in the conductive patterns using the pad patterns without the air gap.

Further, according to the exemplary embodiments of the present invention, since the end portion of each of the recess areas is not formed to have a greater thickness than the center portion of each of the recess areas, the phenomenon in which the center portion of each of the recess areas is previously filled with the conductive material before the end portion of each of the recess areas may be prevented in the process of filling the recess areas with the conductive patterns. Accordingly, the phenomenon in which the air gap is formed in the end portion of each of the conductive patterns may be prevented. Therefore, according to the exemplary embodiments of the present invention, even when forming the contact plugs connected to the conductive patterns by penetrating the pad patterns, the punching phenomenon in which the conductive patterns are completely penetrated due to the contact plugs and the air gap may be prevented.

As described above, the exemplary embodiments of the present invention may reduce process errors by preventing the punching phenomenon of the conductive patterns due to the contact plugs.

Figure 4:
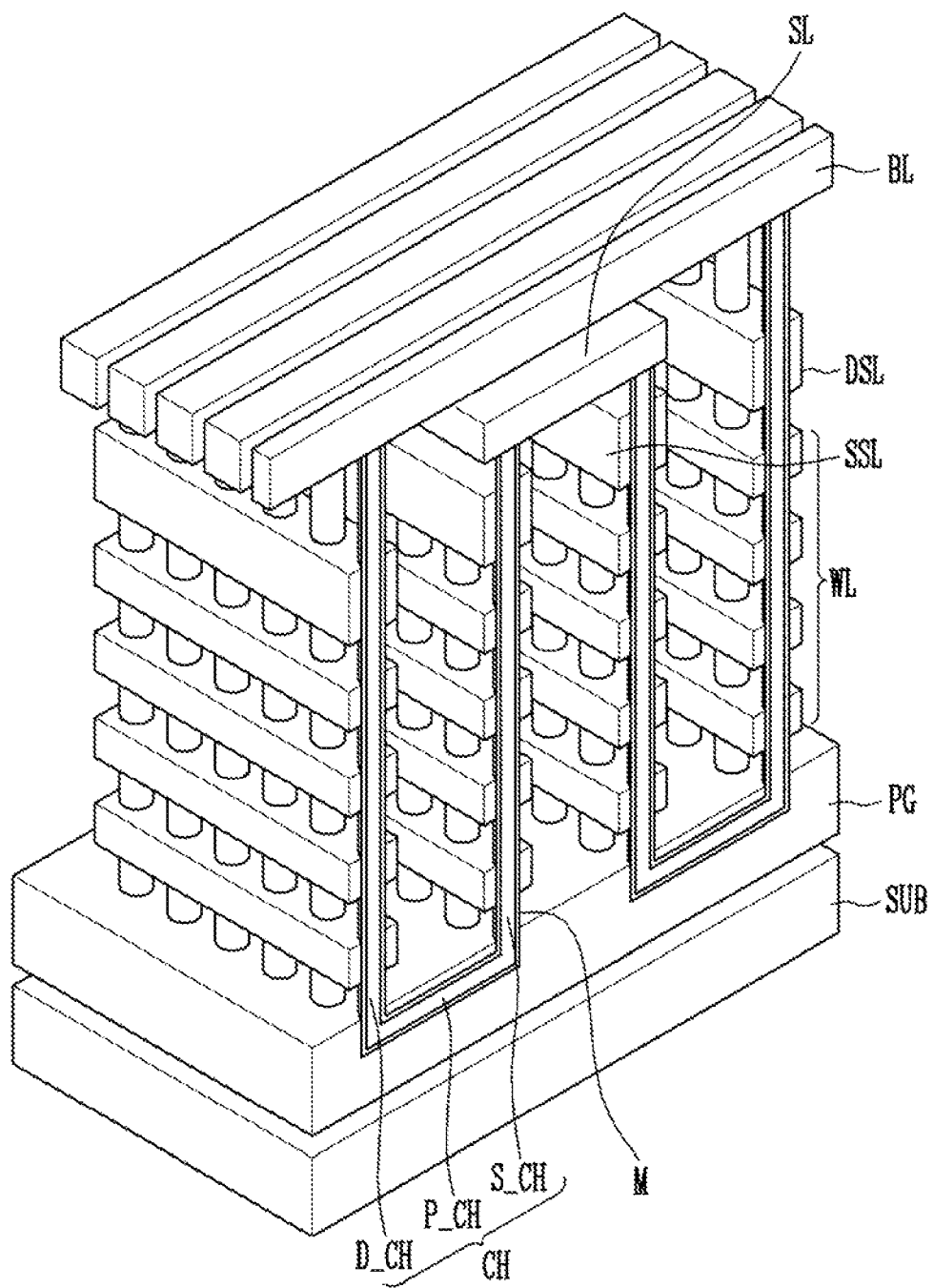
FIGS. 4 and 5 are perspective views illustrating cell structures of semiconductor devices according to exemplary embodiments of the present invention.
Figure 5:
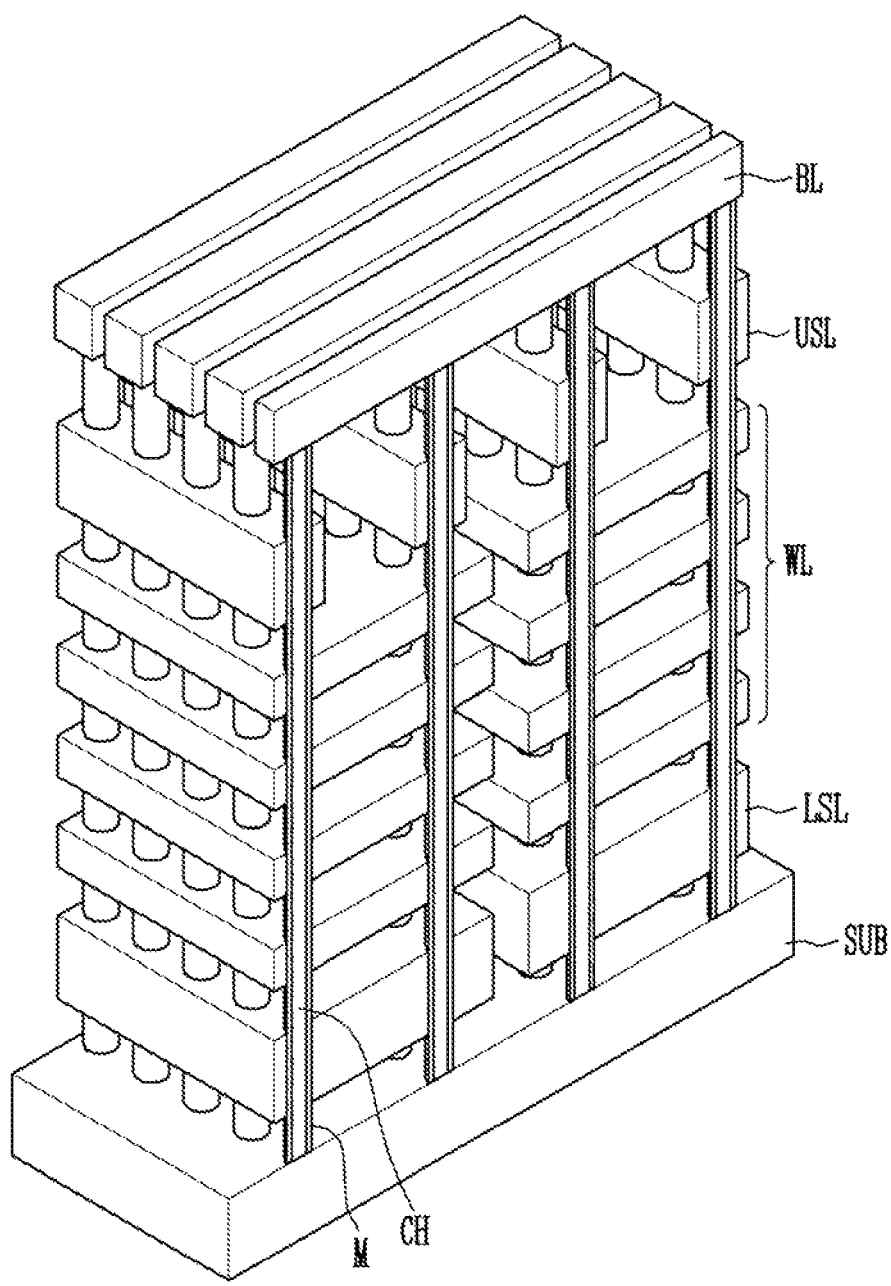

FIGS. 4 and 5 are perspective views illustrating cell structures of semiconductor devices according to exemplary embodiments of the present invention. Hereinafter, with reference to FIGS. 4 and 5, exemplary embodiments of the cell structures formed in the cell region will be described.

FIG. 4 illustrates an example in which memory cells are arranged along a U-shaped channel film CH to form a three-dimensional memory string.

As shown in FIG. 4, a cell structure may include a pipe gate PG, word lines WL, at least one first select line SSL, and at least one second select line DSL, which are stacked on a substrate SUB. The first select line SSL may be a source select line, and the second select line DSL may be a drain select line.

The cell structure may further include a U-shaped channel film CH and a multilayer insulating pattern M covering the U-shaped channel film CH. The multilayer insulating pattern M may have the same structure as that described in FIG. 1. The channel film CH may include a pipe channel film P_CH, a source side channel film S_CH and a drain side channel film D_CH protruding from the pipe channel film P_CH. In FIG. 4, even though an example in which a pair of the source side channel film S_CH and the drain side channel film D_CH are connected to the pipe channel film P_CH is illustrated, two or more source side channel films S_CH may be connected to the pipe channel film P_CH and two or more drain side channel films D_CH may be connected to the pipe channel film P_CH depending on the shape of the memory string.

The source side channel film S_CH may penetrate the word lines WL and the first select line SSL, and the drain side channel film D_CH may penetrate the word lines WL and the second select line DSL. The source side channel film S_CH may be connected to a source line SL and the drain side channel film D_CH may be connected to a bit line BL.

The word lines WL and the first select line SSL between the pipe gate PG and the source line SL, and the word lines WL and the second select line DSL between the pipe gate PG and the bit line BL may be formed by extending the conductive patterns of the contact region shown in FIG. 1 or 3 toward the cell region. The first and second select lines SSL and DSL may further include pad patterns extended from the contact region shown in FIG. 1 or 3.

According to the structure described above, at least one drain select transistor, memory cells, and at least one source select transistor, which are serially connected, may form one memory string and be arranged in a U shape.

The cell structure described above may be formed using the process described with reference to FIGS. 2A to 2H or the process described with reference to FIG. 3. Before performing the process described in detail with reference to FIGS. 2A to 2H or the process described in detail with reference in FIG. 3, the pipe gate PG in which the pipe trench is formed may be previously formed.

FIG. 5 illustrates an example in which the memory cells are arranged along the channel film CH in a straight type to form a three-dimensional memory string.

As shown in FIG. 5, a cell structure may include at least one first select line LSL, word lines WL, and at least one second select line USL, which are sequentially stacked on a substrate SUB including a source region. The cell structure may include a channel film CH connected to the substrate SUB and formed in a straight type, and a multilayer insulating pattern M covering the channel film CH. The multilayer insulating pattern M may have the same structure as that described in FIG. 1. The channel film CH may be connected between the substrate SUB and the bit lines BL. In particular, the channel film CH may be connected to the source region of the substrate SUB.

The word lines WL and the second select line USL between the first select line LSL and the bit line BL may be formed by extending the conductive patterns of the contact region, shown in FIG. 1 or 3, toward the cell region. The second select line USL may further include pad patterns extended from the contact region shown in FIG. 1 or 3. The first select line LSL may be formed to have the same structure as the second select line USL or the word lines WL. The first select line LSL may be formed to have the same thickness as each of the word lines WL or a greater thickness than each of the word lines WL.

According to the structure described above, at least one first select transistor, memory cells, and at least one second select transistor, which are serially connected, may form one memory string and be arranged in a line.

The cell structure described above may be formed using the process described in detail with reference to FIGS. 2A to 2H, or the process described in detail with reference to FIG. 3.

Figure 6:
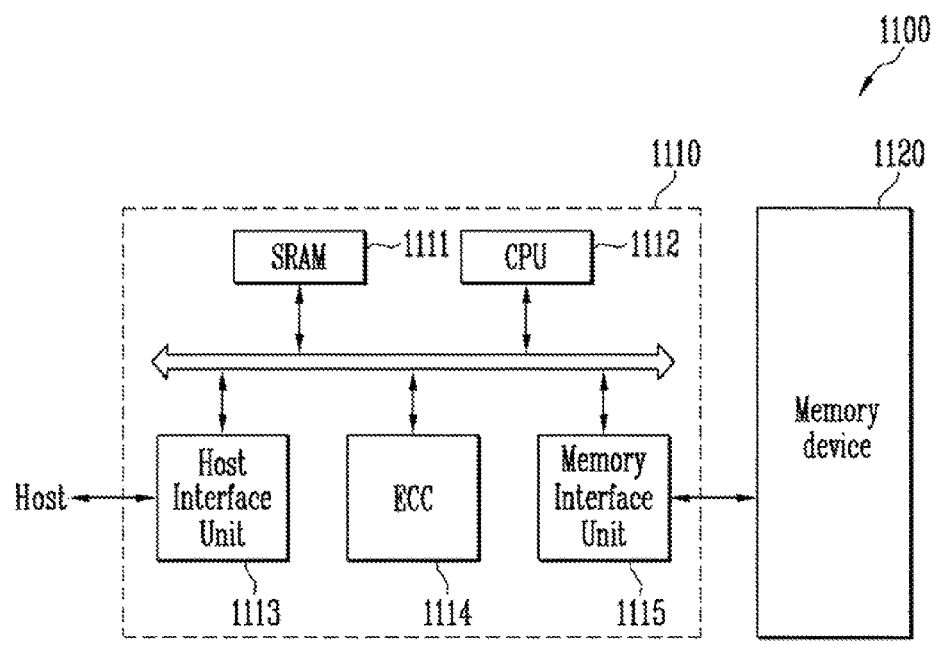
FIG. 6 is a diagram illustrating a configuration of a memory system according to an exemplary embodiment of the present invention.

FIG. 6 is a diagram illustrating a configuration of a memory system according to an exemplary embodiment of the present invention.

Referring to FIG. 6, a memory system 1100 according to an exemplary embodiment of the present invention may include a memory device 1120 and a memory controller 1110.

The memory device 1120 may have the structure described in the exemplary embodiments described in detail with reference to FIGS. 1 to 5. Further, the memory device 1120 may be a multi-chip package configured by a plurality of flash memory chips.

The memory controller 1110 may be configured to control the memory device 1120, and may include static random access memory (SRAM) 1111, a central processing unit (CPU) 1112, a host interface unit 1113, an error correcting code (ECC) unit 1114, and a memory interface unit 1115. The SRAM 1111 may be used as operation memory of the CPU 1112. The CPU 1112 may perform various control operations for data exchange of the memory controller 1110, and the host interface unit 1113 may include the data exchange protocol of a host connected to the memory system 1100. Further, the ECC unit 1114 may detect and correct errors included in data read from the memory device 1120, and the memory interface unit 1115 may perform an interface operation with the memory device 1120. Additionally, the memory controller 1110 may further include read only memory (ROM), etc. for storing code data for interfacing with the host.

The memory system 1100 having the structure described above may be a memory card or a solid state drive (SSD) formed by combining the memory device 1120 and the memory controller 1110 into a single semiconductor device. For example, when the memory system 1100 is an SSD, the memory controller 1110 may communicate with the outside (for example, the host) through one among various interface protocols such as a Universal Serial Bus (USB) protocol, a MultiMediaCard (MMC) protocol, a Peripheral Component Interconnect-Express (PCI-E) protocol, a Serial-Advanced Technology Attachment (SATA) protocol, a Parallel-ATA (PATA) protocol, a Small Computer System Interface (SCSI) protocol, an Enhanced Small Disk Interface (ESDI) protocol, an Integrated Drive Electronics (IDE) protocol, etc.

Figure 7:
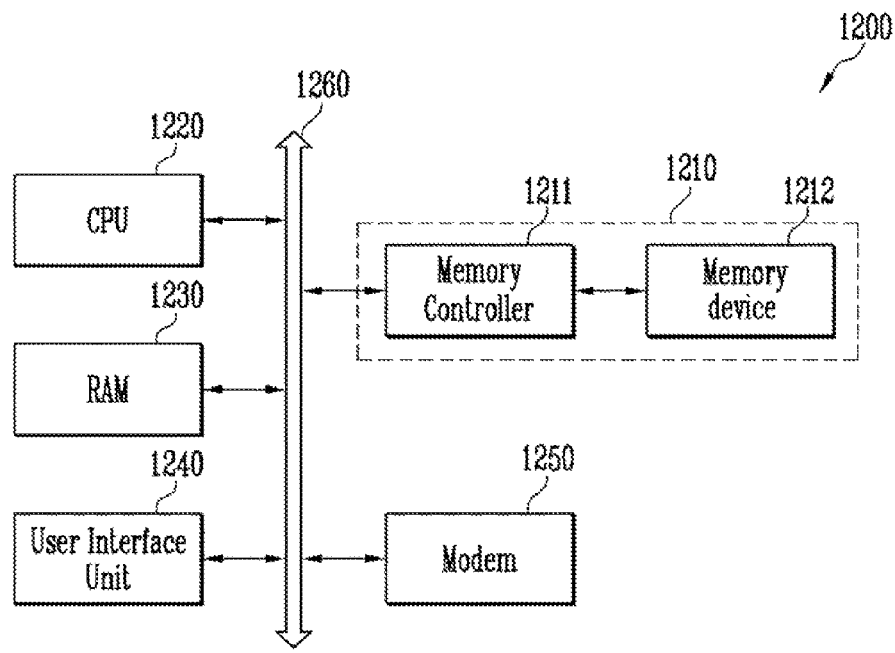
FIG. 7 is a diagram illustrating a configuration of a computing system according to an exemplary embodiment of the present invention.

FIG. 7 is a diagram illustrating the configuration of a computing system according to an exemplary embodiment of the present invention.

Referring to FIG. 7, a computing system 1200 according to an exemplary embodiment of the present invention may include a central processing unit (CPU) 1220, a RAM 1230, a user interface unit 1240, a modem 1250, and a memory system 1210, which are electrically connected to a system bus 1260. When the computing system 1200 is a mobile device, the computing system 1200 may further include a battery for supplying an operating voltage to the computing system 1200, and may further include an application chip set, a camera image processor (CIS), a mobile DRAM device, etc.

The memory system 1210 may include a memory device 1212 and a memory controller 1211 as described with reference to FIG. 6.

In the present invention, pad patterns are formed on sacrificial films in advance by a separate deposition process and etch process before replacing the sacrificial films with the conductive patterns. Accordingly, in the present invention, a phenomenon in which an air gap is formed in the pad patterns may be prevented, and the end portion of each of recess areas filled with the conductive patterns need not be formed to be very thick.

In the present invention, since the pad patterns without the air gap are used, the punching phenomenon may be prevented from occurring in the conductive patterns while forming the contact plugs connected to the pad patterns.

In the drawings and specification, typical exemplary embodiments of the invention have been disclosed and, although specific terms are employed, they are used in a generic and descriptive sense only and not for purposes of limiting the inventive concept. As for the scope of the invention, it is to be set forth in the following claims. Therefore, it will be understood by those of ordinary skill in the art that various changes in form and detail may be made without departing from the spirit and scope of the present invention as defined by the following claims.

What is claimed is:

1. A method of fabricating a semiconductor device, comprising:
   forming a stacked body including sacrificial films and interlayer insulating films which are alternately stacked, and having a stair structure exposing end portions of the sacrificial films;
   forming pad patterns on the end portions of the sacrificial films that are exposed through the stair structure, wherein the sacrificial films are formed of an insulating material;
   forming recess areas by removing the sacrificial films; and
   forming conductive patterns in the recess areas.

2. The method of fabricating the semiconductor device of claim 1, wherein the forming of the stacked body comprises:
   forming a preliminary stair structure exposing end portions of upper surfaces of the interlayer insulating films by etching the sacrificial films and the interlayer insulating films; and
   exposing end portions of upper surfaces of the sacrificial films by etching the end portions of the upper surfaces of the interlayer insulating films that are exposed through the preliminary stair structure.

3. The method of fabricating the semiconductor device of claim 1, wherein the forming of the pad patterns comprises:
   forming a first conductive film along sidewalls and upper surfaces of the stacked body;
   forming a protective film along a surface of the first conductive film;
   forming protective patterns on first portions of the first conductive film formed on the upper surfaces of the stacked body by etching the protective film to expose second portions of the first conductive film that are formed on the sidewalls of the stacked body; and
   removing the second portions of the first conductive film by using the protective pattern as an etching mask.

4. The method of fabricating the semiconductor device of claim 3, wherein the protective film is formed to have a greater thickness on the upper surfaces of the stacked body than on the sidewalls of the stacked body.

5. The method of fabricating the semiconductor device of claim 3, wherein the protective film comprises at least one selected from a group consisting of a high density plasma (HDP) oxide film, a plasma enhanced-tetra ethyl ortho silicate (PE-TEOS) oxide film, an undoped silicate glass (USG) oxide film, and a plasma enhanced (PE) nitride film.

6. The method of fabricating the semiconductor device of claim 3, wherein the forming of the first conductive film comprises:
   forming a first barrier metal film along the sidewalls and upper surfaces of the stacked body; and
   forming a first metal film on the first barrier metal film.

7. The method of fabricating the semiconductor device of claim 1, wherein the forming of the conductive patterns comprises:
   forming a second barrier metal film along surfaces of the recess areas; and forming a second metal film filling the recess areas on the second barrier metal film.

8. The method of fabricating the semiconductor device of claim 1, before the forming of the conductive patterns, further comprising:
forming insulating films along surfaces of the recess areas.

9. The method of fabricating the semiconductor device of claim 8, after the forming of the conductive patterns, further comprising:
forming contact plugs connected to the conductive patterns by penetrating the pad patterns and the insulating films.

10. A semiconductor device, comprising:
conductive patterns and interlayer insulating patterns having a stair structure and being alternately stacked;
pad patterns formed on end portions of upper surfaces of the conductive patterns exposed through the stair structure, each of the pad patterns including a first metal film and a first barrier metal film, wherein the first barrier metal film is formed between the a bottom surface of the first metal film and one of the conductive patterns; and
a channel film penetrating the conductive patterns and the interlayer insulating patterns.

11. The semiconductor device of claim 10, wherein an uppermost pad pattern of the pad patterns extends along an upper surface of an uppermost conductive pattern of the conductive patterns and is in contact with the uppermost conductive pattern.

12. The semiconductor device of claim 11, wherein the channel film penetrates the uppermost pad pattern of the pad patterns.

13. The semiconductor device of claim 10, further comprising:
protective patterns formed on the pad patterns.

14. The semiconductor device of claim 10, wherein
the first barrier metal film extends between one of the interlayer insulating patterns disposed between the conductive patterns and a sidewall of the first metal film.

15. The semiconductor device of claim 10, wherein each of the conductive patterns comprises:
a second metal film; and
a second barrier metal film formed along a surface of the second metal film.

16. The semiconductor device of claim 10, further comprising:
insulating films covering surfaces of the conductive patterns.

17. The semiconductor device of claim 16, further comprising:
contact plugs connected to the conductive patterns by penetrating the pad patterns and the insulating films.

18. The semiconductor device of claim 10, wherein an end portion of each of the conductive patterns is formed to have the same thickness as a remaining portion of each of the conductive patterns or a thickness that is less than the remaining portion of each of the conductive patterns.

19. A semiconductor device, comprising:
conductive patterns and interlayer insulating patterns having a stair structure and being alternately stacked;
insulating films covering surfaces of the conductive films;
pad patterns formed on end portions of the insulating films exposed through the stair structure; and
contact plugs connected to the conductive patterns by penetrating the pad patterns and the insulating films.

20. The semiconductor device of claim 19, wherein an end portion of each of the conductive patterns is formed to have the same thickness as a remaining portion of each of the conductive patterns or a thickness that is less than the remaining portion of each of the conductive patterns.

* * * * *